US012610852B2

(12) United States Patent
Yang et al.

(10) Patent No.: US 12,610,852 B2
(45) Date of Patent: Apr. 21, 2026

(54) SWITCHING POWER MODULE AND COMMUNICATIONS DEVICE

(71) Applicant: HUAWEI TECHNOLOGIES CO., LTD., Guangdong (CN)

(72) Inventors: Gun Yang, Dongguan (CN); Fayou Yin, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 564 days.

(21) Appl. No.: 18/064,355

(22) Filed: Dec. 12, 2022

(65) Prior Publication Data

US 2023/0112034 A1     Apr. 13, 2023

Related U.S. Application Data

(63) Continuation of application No. PCT/CN2020/112652, filed on Aug. 31, 2020.

(51) Int. Cl.
H01L 23/31       (2006.01)
H01L 21/02       (2006.01)
(Continued)

(52) U.S. Cl.
CPC .... H01L 23/3192 (2013.01); H01L 21/02126 (2013.01); H01L 21/02274 (2013.01);
(Continued)

(58) Field of Classification Search
CPC ........................ H01L 23/3192; H01L 23/3171
See application file for complete search history.

(56) References Cited

U.S. PATENT DOCUMENTS 6,521,975 B1     2/2003   West et al.
6,803,327 B1     10/2004  Cheu et al.
(Continued)

FOREIGN PATENT DOCUMENTS

CN        106960801 A      7/2017
CN        107256833 A      10/2017
(Continued)

OTHER PUBLICATIONS

International Search Report and Written Opinion issued in PCT/CN2020/112652, dated Jun. 4, 2021, 9 pages.
(Continued)

*Primary Examiner* — Erik Kielin

(57)       ABSTRACT

The technology of this application relates to a switching power module that includes a substrate, a die embedded in the substrate, and a packaging layer. The packaging layer covers an integrated circuit layout layer of the die. The packaging layer packages the integrated circuit layout layer of the die, the die includes a composite material layer covering the integrated circuit layout layer, and the composite material layer includes at least two material layers that have different functions. The at least two material layers include a first material layer covering the integrated circuit layout layer, the first material layer is a mixed layer of undoped silicate glass and tetraethyl orthosilicate, and the first material layer is filled in a gap between metal protrusions of the integrated circuit layout layer, thereby improving an isolation effect between the metal protrusions. The mixed layer of the undoped silicate glass and the tetraethyl orthosilicate has a good thermal stress effect.

9 Claims, 3 Drawing Sheets

(51) Int. Cl.

| | | |
|---|---|---|
| *H01L 23/00* | (2006.01) | |
| *H01L 23/16* | (2006.01) | |
| *H01L 23/50* | (2006.01) | |

(52) U.S. Cl.
 CPC .......... *H01L 23/16* (2013.01); *H01L 23/3171*
 (2013.01); *H01L 23/50* (2013.01); *H01L*
 *23/562* (2013.01)

(56) References Cited

U.S. PATENT DOCUMENTS

| | | | |
|---|---|---|---|
| 7,651,891 B1 | 1/2010 | Nguyen | |
| 8,071,430 B2 | 12/2011 | Summerfelt et al. | |
| 2001/0013638 A1* | 8/2001 | Lam .................. | H01L 21/31116 |
| | | | 257/E21.252 |
| 2006/0292851 A1* | 12/2006 | Lin ......................... | H01L 24/03 |
| | | | 438/618 |
| 2010/0165585 A1* | 7/2010 | Lin ....................... | H01L 23/642 |
| | | | 361/748 |
| 2015/0294966 A1* | 10/2015 | Weyers .................. | H10D 62/83 |
| | | | 257/49 |
| 2017/0194230 A1* | 7/2017 | Prechtl .................. | H01L 23/562 |
| 2018/0047673 A1 | 2/2018 | Gu et al. | |
| 2018/0302046 A1* | 10/2018 | Mitzlaff .................. | H01L 23/66 |
| 2020/0185297 A1 | 6/2020 | Konrath et al. | |

FOREIGN PATENT DOCUMENTS

| | | |
|---|---|---|
| CN | 110890325 A | 3/2020 |
| JP | 2000286261 A | 10/2000 |

OTHER PUBLICATIONS

Office Action for Chinese Application No. 202080030179.9 dated Mar. 11, 2023, 7 pages.
European Search Report for EP Application No. 20950897 dated Feb. 15, 2023, 13 pages.

* cited by examiner

SWITCHING POWER MODULE AND COMMUNICATIONS DEVICE

CROSS-REFERENCE TO RELATED APPLICATION(S)

This application is a continuation of International Application No. PCT/CN2020/112652, filed on Aug. 31, 2020, the disclosure of which is hereby incorporated by reference in its entirety.

TECHNICAL FIELD

This application relates to the field of electronic technologies, and in particular, to a switching power module and a communications device.

BACKGROUND

High power density and miniaturization are a technical development trend of a switching power module. With application of a 5th generation communications technology, power density of a circuit board increases, power consumption of the circuit board also increases, and a daily temperature difference of the circuit board accordingly increases. Therefore, a demand for a switching power module with high power density and a long temperature cycle life is to greatly increase in the future. To ensure reliability of the switching power module during use, a passivation layer is disposed on a die of the circuit board to protect a circuit on the die. However, if a temperature change rate of a cyclic temperature around the switching power module is relatively large, for example, the temperature change rate is between minus 40 degrees Celsius and 100 degrees Celsius, the passivation layer in the conventional technology is prone to be cracked because of being in the temperature difference change for long time, causing a failure of the switching power module. Therefore, a requirement of the switching power supply module for long-time reliable operation under this temperature cycle condition cannot be met.

SUMMARY

This application provides a switching power module and a communications device, to improve reliability of the switching power module.

According to a first aspect, a switching power module is provided. The switching power module may be applied to the field of switching power modules. The switching power module includes a substrate configured to carry a die, and the die embedded in the substrate, and further includes a packaging layer configured to package an integrated circuit layout layer of the die. The integrated circuit layout layer is located on a surface of the die. To improve reliability of the die, the packaging layer in this application covers the integrated circuit layout layer of the die. The packaging layer packages the integrated circuit layout layer of the die, the die includes a composite material layer covering the integrated circuit layout layer, and the composite material layer includes at least two material layers that have different functions. The at least two material layers include a first material layer covering the integrated circuit layout layer, the first material layer is a mixed layer of undoped silicate glass and tetraethyl orthosilicate, and the first material layer is filled in a gap between metal protrusions of the integrated circuit layout layer, thereby improving an isolation effect between the metal protrusions. In addition, the mixed layer of the undoped silicate glass and the tetraethyl orthosilicate has a good thermal stress effect. Therefore, when a relatively large temperature difference cycle change occurs during working of the die, the first material layer does not crack, thereby improving a protection effect for the die and also improving reliability of the die.

In a specific implementable solution, a mixing ratio of the undoped silicate glass to the tetraethyl orthosilicate is greater than or equal to 5:9 and less than or equal to 10:3. The first material layer that uses the ratio has a good thermal stress effect.

In a specific implementable solution, a thickness of the first material layer is greater than or equal to 3000 angstroms and less than or equal to 9000 angstroms. When the thickness is used, it is ensured that the first material layer has a good thermal stress effect.

In a specific implementable solution, a thickness of the first material layer is greater than or equal to 5600 angstroms and less than or equal to 6400 angstroms. This ensures that the first material layer has a good thermal stress effect.

In a specific implementable solution, the at least two material layers further include a second material layer covering the first material layer. The second material layer is silicon oxynitride or tetraethyl orthosilicate. The second material layer has a good thermal stress effect.

In a specific implementable solution, a thickness of the second material layer is greater than or equal to 1000 angstroms and less than or equal to 3000 angstroms. The second material layer has a good thermal stress effect.

In a specific implementable solution, a thickness of the second material layer is greater than or equal to 1700 angstroms and less than or equal to 2300 angstroms. The second material layer has a good thermal stress effect.

In a specific implementable solution, the at least two material layers further include a third material layer covering the second material layer. The third material layer is an ultraviolet silicon nitride layer. The third material layer has a good thermal stress effect.

In a specific implementable solution, a thickness of the third material layer is greater than or equal to 2000 angstroms and less than or equal to 6000 angstroms. The third material layer has a good thermal stress effect.

In a specific implementable solution, a thickness of the third material layer is greater than or equal to 3700 angstroms and less than or equal to 4300 angstroms. The third material layer has a good thermal stress effect.

In a specific implementable solution, the third material layer is formed on the second material layer in a sputtering manner. This ensures that the third material layer is reliably connected to the second material layer.

In a specific implementable solution, the first material layer is formed, through high-density plasma deposition, on a surface that is of the die and that faces away from the substrate.

In a specific implementable solution, a total thickness of the passivation layer is greater than or equal to 6000 angstroms and less than or equal to 18000 angstroms. This improves a protection effect of the passivation layer for the die.

According to a second aspect, a communications device is provided. The communications device includes the switching power module according to any one of the first aspect and the specific implementable solutions of the first aspect, and a control component connected to the switching power module. A mixed layer formed by using undoped silicate glass and tetraethyl orthosilicate is filled in a gap between metal protrusions of an integrated circuit layout layer, thereby improving an isolation effect between the metal protrusions. In addition, the mixed layer of the undoped silicate glass and the tetraethyl orthosilicate has a good thermal stress effect. Therefore, when a relatively large temperature difference cycle change occurs during working of a die, a first material layer does not crack, thereby improving a protection effect for the die and also improving reliability of the die.

DESCRIPTION OF EMBODIMENTS

For ease of understanding, an application scenario of a switching power module provided in embodiments of this application is first described. The switching power module provided in embodiments of this application is applied to a communications device, and is configured to control working status switching of the communications device. In the conventional technology, high power density and miniaturization are a technical development trend of a switching power module.

With application of a 5th generation communications technology, power density of a circuit board further increases, and consequently power consumption of the circuit board accordingly increases. When the circuit board is used, a daily temperature difference of the circuit board also accordingly increases. Therefore, a demand for a switching power module with high power density and a long temperature cycle life is to greatly increase.

Figure 1:
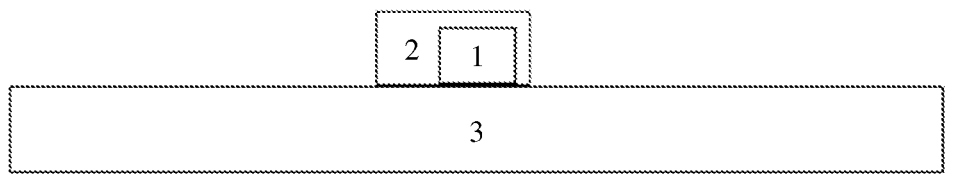
FIG. 1 is an example schematic diagram of an application scenario of a switching power module according to an embodiment of this application.

For high power density and miniaturization of the circuit board, currently there is a packaging manner applicable to a circuit board with high power density. A packaged die shown in FIG. 1 includes a substrate 2, and the substrate 2 may be an organic substrate. A bare die 1 and a passivation layer (not shown in the figure) that packages the bare die 1 are embedded in the substrate 2. The passivation layer is configured to implement electrical isolation between internal components of the die 1 and also protect interconnection between the internal components, and further can protect the components in the die 1 from being mechanically and chemically damaged. A material and a structure of the passivation layer greatly affect a stress release rate of the packaged die. The packaged die is disposed on a circuit board 3. The die 1 is electrically connected (not shown in the figure) to the circuit board 3 to form a switching power module. When the switching power module is used and a temperature difference of the circuit board is relatively large, whether the passivation layer can well release a thermal stress directly affects reliability of the packaged die.

For example, a temperature cycle reliability test may be used to verify a temperature cycle life of the switching power module. A verification condition is usually as follows: A temperature circulates between minus 40 degrees Celsius and 100 degrees Celsius, a temperature change rate is greater than or equal to 10 degrees Celsius per minute, and a stage of minus 40 degrees Celsius and a stage of 100 degrees Celsius each need to be maintained for at least 15 minutes. In addition, when the switching power module is in a rating working area after being powered on, a power failure cannot occur during 1000 cycles. In this way, a temperature cycle tolerance of the passivation layer of the die is checked, and a determining basis is whether the passivation layer of the die is cracked. When a switching power module in the conventional technology is verified, under repeated actions of a thermal stress, a passivation layer is separated from a neighboring insulation layer on the die, and a metal layer of the die migrates under excitation of an electric potential difference, causing damage to the die. In view of this, embodiments of this application provide die packaging. The following describes the die packaging in detail with reference to specific accompanying drawings and embodiments.

Figure 2:
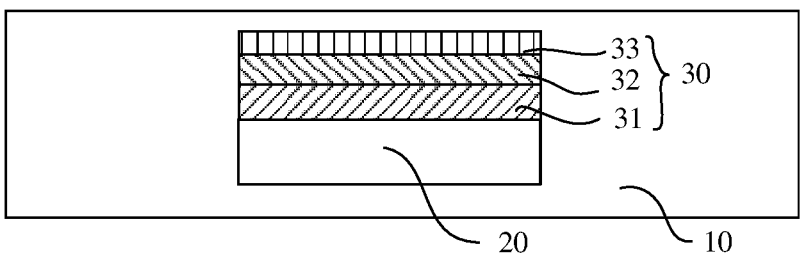
FIG. 2 is an example schematic diagram of a structure of a switching power module according to an embodiment of this application.

FIG. 2 is a cutaway drawing of a switching power module according to an embodiment of this application. The switching power module provided in this embodiment of this application includes a substrate 10, a die 20, and a packaging layer 30. The substrate 10 is configured to carry the die 20 and the packaging layer 30 as a carrying component. The packaging layer 30 is configured to protect security of the die 20 as a protection component of the die 20. The following describes the switching power module with reference to accompanying drawings and specific embodiments.

The substrate 10 provided in this embodiment of this application may be a circuit board, and the substrate 10 has a circuit layer electrically connected to the die 20. During assembly, the die 20 is embedded in the substrate 10, and can be connected to the circuit layer of the substrate 10 to form a circuit, to complete a function of the die 20.

The die 20 has an integrated circuit layout layer (not shown in the figure). The integrated circuit layout layer is disposed on a surface of the die 20, and the integrated circuit layout layer is configured to be electrically connected to the circuit layer of the substrate 10.

The packaging layer 30 is configured to package the integrated circuit layout layer of the die 20 to ensure security of the integrated circuit layout layer of the die 20. During disposition, the packaging layer 30 includes a composite material layer covering the integrated circuit layout layer, and the composite material layer includes at least two material layers that have different functions. The following describes, in detail with reference to accompanying drawings, the at least two material layers of the composite material layer provided in this embodiment of this application.

Figure 3:
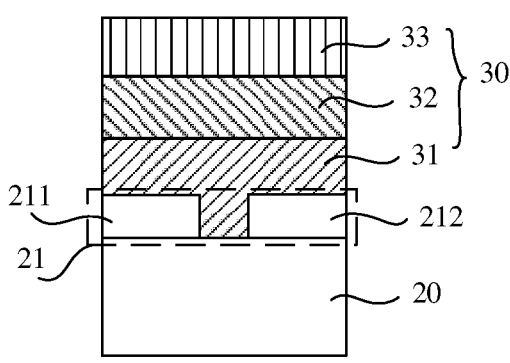
FIG. 3 is an example partially enlarged diagram of a switching power module according to an embodiment of this application.

FIG. 3 is a schematic diagram of cooperation between the die and the packaging layer. The die 20 provided in this embodiment of this application is a bare die, and the integrated circuit layout layer 21 of the die 20 is a circuit on the die 20. It should be understood that there is a gap in the integrated circuit layout layer 21 of the die 20. Two metal protrusions of the integrated circuit layout layer 21 shown in FIG. 2 are used as an example. The two metal protrusions are a first cable 211 and a second cable 212. The first cable 211 and the second cable 212 each are a solid metal part of the integrated circuit layout layer 21. A gap between the first cable 211 and the second cable 212 is the gap of the integrated circuit layout layer 21.

The packaging layer 30 covers the integrated circuit layout layer 21 of the die 20 during packaging. The packaging layer 30 provided in this embodiment of this application uses a three-layer structure. A first material layer 31 covers the die 20, a second material layer 32 covers the first material layer 31, and a third material layer 33 covers the second material layer 32. The die 20 is sequentially covered by the first material layer 31, the second material layer 32, and the third material layer 33, to protect the die 20.

When covering the die 20, the first material layer 31 covers the integrated circuit layout layer 21 of the die 20, and is filled in a gap between metal protrusions of the integrated circuit layout layer 21 to implement electrical isolation between internal components of the die 20. The first cable 211 and the second cable 212 are used as an example. The first material layer 31 has a protrusion filled in the gap between the first cable 211 and the second cable 212, and the protrusion physically isolates the first cable 211 and the second cable 212. In addition, the first material layer 31 is prepared by using an insulating material. Therefore, the formed protrusion electrically isolates the first cable 211 and the second cable 212.

To improve a protection effect of the packaging layer 30 for the die 20, the first material layer 31 is formed as a mixed layer by using a mixture that is of undoped silicate glass and tetraethyl orthosilicate and that is prepared by using a high-density plasma chemical vapor deposition method. During preparation, first, a first layer of structure is prepared on the integrated circuit layout layer 21 by using the undoped silicate glass, and then a second layer of structure is prepared on the first layer of structure by using the tetraethyl orthosilicate. A ratio of the undoped silicate glass to the tetraethyl orthosilicate may be greater than or equal to 5:9 and less than or equal to 10:3. For example, the ratio of the undoped silicate glass to the tetraethyl orthosilicate may be different ratios such as 5:9, 2:3, 10:11, and 10:3. The undoped silicate glass has good hole filling density and is relatively hard. The tetraethyl orthosilicate has good coverage and is relatively soft. When the undoped silicate glass is mixed with the tetraethyl orthosilicate, the undoped silicate glass can tolerate a relatively large pressure like concrete, and the tetraethyl orthosilicate can absorb a part of a stress like a sponge, so that the first material layer 31 has both good hardness and good flexibility. When a temperature difference sharply changes or a temperature difference period changes, the first material layer 31 can tolerate a temperature change between minus 40 degrees Celsius and 100 degrees Celsius, and can relatively rapidly absorb heat generated by the die 20, to avoid deformation of the first material layer 31 due to the heat generated by the die 20, thereby reducing a cracking risk of the first material layer 31.

In an optional solution, a thickness of the first material layer 31 may be greater than or equal to 3000 angstroms and less than or equal to 9000 angstroms, to ensure that the first material layer 31 has an enough thickness to improve a thermal stress effect of the packaging layer 30. For example, the thickness of the first material layer 31 may be any thickness greater than or equal to 3000 angstroms and less than or equal to 9000 angstroms, such as 3000 angstroms, 3500 angstroms, 4000 angstroms, 4500 angstroms, 5000 angstroms, 5600 angstroms, 6000 angstroms, 6400 angstroms, 7000 angstroms, 7500 angstroms, 8000 angstroms, 8500 angstroms, or 9000 angstroms.

When the first material layer 31 is specifically prepared, the first material layer 31 may be directly prepared on the die 20 in a chemical deposition manner. For example, the first material layer 31 may be prepared on the die 20 through high-density plasma chemical vapor deposition. During specific preparation, first, the undoped silicate glass is mixed with the tetraethyl orthosilicate, and then the mixture is prepared on the die 20 through high-density plasma chemical vapor deposition. When the first material layer 31 is formed through deposition, the first material layer 31 covers the integrated circuit layout layer 21 of the die 20.

The composite material layer may further include the second material layer 32, and both a material and a function of the second material layer 32 are different from those of the first material layer 31. During specific disposition, the second material layer 32 covers the first material layer 31, and a material of the second material layer 32 may be silicon oxynitride or tetraethyl orthosilicate. During disposition, the second material layer 32 is stacked with the first material layer 31, and is located on a surface that is of the first material layer 31 and that faces away from the die 20. During preparation, the second material layer 32 may be formed on the first material layer 31 in a manner of chemical vapor deposition and coating and curing, so that the second material layer 32 can be securely connected to the first material layer 31. Both the silicon oxynitride and the tetraethyl orthosilicate have advantages such as thermal shock resistance, oxidation resistance, high density, an excellent mechanical property, and an excellent chemical stability, and are excellent high-temperature structural materials. The second material layer 32 prepared by using the silicon oxynitride or the tetraethyl orthosilicate can absorb a stress and the heat generated by the die 20, to effectively protect the first material layer 31. In addition, the second material layer 32 has a good thermal shock resistance property, so that the packaging layer 30 can well protect the die 20 when the temperature difference of the die 20 sharply changes or the temperature difference period of the die 20 changes.

In an optional solution, a thickness of the second material layer 32 is greater than or equal to 1000 angstroms and less than or equal to 3000 angstroms, to ensure that the second material layer 32 has an enough thickness to improve a thermal stress effect of the packaging layer 30. For example, the thickness of the second material layer 32 may be any thickness greater than or equal to 1000 angstroms and less than or equal to 3000 angstroms, such as 1000 angstroms, 1300 angstroms, 1700 angstroms, 2000 angstroms, 2100 angstroms, 2300 angstroms, 2500 angstroms, 2700 angstroms, or 3000 angstroms.

The composite material layer may further include the third material layer 33. The third material layer 33 covers the second material layer 32, and a material of the third material layer 33 may be ultraviolet silicon nitride (UVSIN). When the third material layer 33 is prepared, the third material layer 33 is stacked with the second material layer 32 during disposition, and is located on a surface that is of the second material layer 32 and that faces away from the first material layer 31. During preparation, the third material layer 33 may be directly formed on the second material layer 32 in a sputtering manner, so that the third material layer 33 can be securely connected to the first material layer 31. The third material layer has good thermal shock resistance and good chemical stability because of being made of the ultraviolet silicon nitride.

In an optional solution, a thickness of the third material layer 33 is greater than or equal to 2000 angstroms and less than or equal to 6000 angstroms, to ensure that the third material layer 33 has an enough thickness to improve a thermal stress effect of the packaging layer 30. For example, the thickness of the third material layer 33 may be any thickness greater than or equal to 2000 angstroms and less than or equal to 6000 angstroms, such as 2000 angstroms, 2500 angstroms, 3000 angstroms, 3700 angstroms, 4000 angstroms, 4300 angstroms, 5200 angstroms, 5700 angstroms, or 6000 angstroms.

When the packaging layer 30 is formed by using the first material layer 31, the second material layer 32, and the third material layer 33, a height of the packaging layer 30 can be controlled to be greater than or equal to 6000 angstroms and less than or equal to 18000 angstroms. For example, an overall thickness of the packaging layer 30 may be different thicknesses, such as 6000 angstroms, 7000 angstroms, 11000 angstroms, 11500 angstroms, 12000 angstroms, 12500 angstroms, 13000 angstroms, and 1800 angstroms.

It should be understood that the composite material layer included in the packaging layer provided in this embodiment of this application is not limited to the three-layer material layer shown in FIG. 3, and may be alternatively a material layer of another layer quantity as required.

To facilitate understanding of an effect of the packaging layer 30 provided in this embodiment of this application, temperature cycle reliability tests are performed on the packaging layer 30 shown in FIG. 3 and a packaging layer in the conventional technology to perform comparison.

The packaging layer in the conventional technology uses four layers of materials. A material of a first layer covering a die is silicon dioxide or ethyl orthosilicate, and a thickness of the first layer is 2000 angstroms to 6000 angstroms. A material of a second layer is silicon dioxide, and a thickness of the second layer is 2000 angstroms to 6000 angstroms. A material of a third layer is tetraethyl orthosilicate, and a thickness of the third layer is 2000 angstroms to 6000 angstroms. A material of a fourth layer is silicon nitride, and a thickness of the fourth layer is 3000 angstrom to 6000 angstroms. When a temperature cycle reliability test is performed on the packaging layer, when a temperature difference is greater than or equal to 60 degrees Celsius, the packaging layer is cracked. Therefore, a requirement of a current switching power module cannot be met.

When a temperature cycle reliability test is performed on the packaging layer 30 provided in this embodiment of this application, when a temperature around the packaging layer 30 provided in this embodiment of this application circulates between minus 40 degrees Celsius and 100 degrees Celsius, a temperature change rate is greater than or equal to 10 degrees Celsius per minute, and a stage of minus 40 degrees Celsius and a stage of 100 degrees Celsius each need to be maintained for at least 15 minutes, the packaging layer 30 is still kept uncracked. In addition, when the switching power module is in a rating working area after being powered on, no power failure occurs in 1000 cycles.

It can be learned from the comparison that, the packaging layer 30 provided in this embodiment of this application can have a good thermal stress effect through cooperation between the first material layer 31, the second material layer 32, and the third material layer 33. Therefore, under the premise of ensuring reliably of the die 20 during working, a quantity of layers of the packaging layer 30 is reduced, and a thickness of the packaging layer 30 is also reduced, thereby facilitating miniaturization development of the switching power module.

To facilitate understanding of the switching power module provided in this embodiment of this application, the following describes, in detail with reference to specific accompanying drawings, a method for preparing the switching power module shown in FIG. 3.

Step 001: Cover an integrated circuit layout layer of a die with a first material layer.

Figure 4:
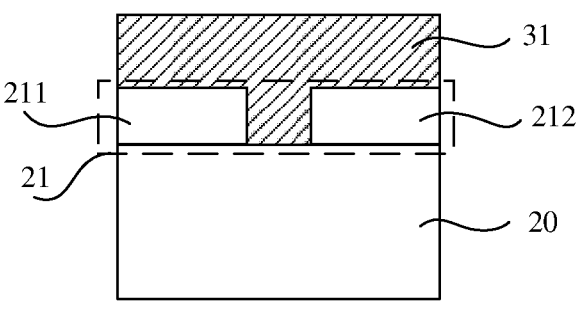
FIG. 4 to FIG. 7 are example preparation flow of die packaging according to an embodiment of this application.

As shown in FIG. 4, a first material layer 31 is directly prepared, through high-density plasma chemical vapor deposition, on a surface that is of a die 20 and that has an integrated circuit layout layer 21. When the first material layer 31 covers the die 20, the first material layer 31 covers the integrated circuit layout layer 21 of the die 20, and is filled in a gap between metal protrusions of the integrated circuit layout layer 21, to electrically isolate the adjacent metal protrusions.

Two metal protrusions in FIG. 4 are used as an example. The two metal protrusions are a first cable 211 and a second cable 212. The first material layer 31 may be prepared on the die 20 through high-density plasma chemical vapor deposition. During specific preparation, first, a first layer of structure is prepared on the integrated circuit layout layer 21 by using undoped silicate glass, and then a second layer of structure is prepared on the first layer of structure by using tetraethyl orthosilicate. The first material layer 31 further has a protrusion filled in a gap between the first cable 211 and the second cable 212, and the protrusion physically isolates the first cable 211 and the second cable 212. In addition, the undoped silicate glass and the tetraethyl orthosilicate of the first material layer 31 are mixed as an insulating material, so that the formed protrusion can electrically isolate the first cable 211 and the second cable 212.

To improve a protection effect of the packaging layer 30 for the die 20, the first material layer 31 is formed as a mixed layer by using a mixture that is of the undoped silicate glass and the tetraethyl orthosilicate and that is prepared by using a high-density plasma chemical vapor deposition method. A ratio of the undoped silicate glass to the tetraethyl orthosilicate may be greater than or equal to 5:9 and less than or equal to 10:3. For example, the ratio of the undoped silicate glass to the tetraethyl orthosilicate may be different ratios such as 5:9, 2:3, 10:11, and 10:3. The undoped silicate glass has good hole filling density and is relatively hard. The tetraethyl orthosilicate has good coverage and is relatively soft. When the undoped silicate glass is mixed with the tetraethyl orthosilicate, the undoped silicate glass can tolerate a relatively large pressure like concrete, and the tetraethyl orthosilicate can absorb a part of a stress like a sponge, so that the first material layer 31 has both good hardness and good flexibility. When a temperature difference sharply changes or a temperature difference period changes, the first material layer 31 can tolerate a temperature change between minus 40 degrees Celsius and 100 degrees Celsius, and can relatively rapidly absorb heat generated by the die 20, to avoid deformation of the first material layer 31 due to the heat generated by the die 20, thereby reducing a cracking risk of the first material layer 31.

When the first material layer 31 is specifically disposed, a thickness of the first material layer 31 may be greater than or equal to 3000 angstroms and less than or equal to 9000 angstroms, to ensure that the first material layer 31 has an enough thickness to improve a thermal stress effect of the packaging layer. For example, the thickness of the first material layer 31 may be any thickness greater than or equal to 3000 angstroms and less than or equal to 9000 angstroms, such as 3000 angstroms, 3500 angstroms, 4000 angstroms, 4500 angstroms, 5000 angstroms, 5600 angstroms, 6000 angstroms, 6400 angstroms, 7000 angstroms, 7500 angstroms, 8000 angstroms, 8500 angstroms, or 9000 angstroms.

Step 002: Form a second material layer on the first material layer.

Figure 5:
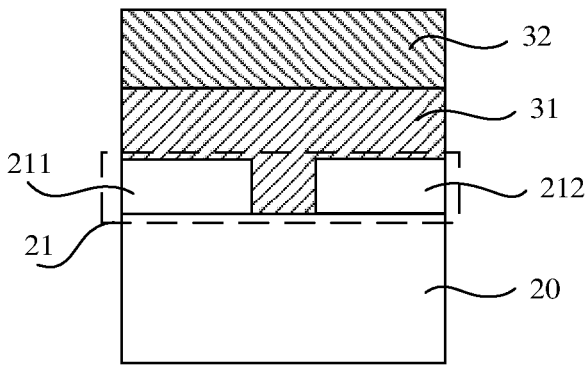

As shown in FIG. 5, for some reference signs in FIG. 5, refer to the same reference signs in FIG. 4. A surface of the first material layer 31 is covered with a second material layer 32, and a material of the second material layer 32 may be silicon oxynitride or tetraethyl orthosilicate. During dispo- sition, the second material layer 32 is stacked with the first material layer 31, and is located on a surface that is of the first material layer 31 and that faces away from the die. During preparation, the second material layer 32 may be formed on the first material layer 31 in a manner of chemical vapor deposition and coating and curing, so that the second material layer 32 can be securely connected to the first material layer 31.

Both the silicon oxynitride and the tetraethyl orthosilicate have advantages such as thermal shock resistance, oxidation resistance, high density, an excellent mechanical property, and an excellent chemical stability, and are excellent high- temperature structural materials. The second material layer 32 prepared by using the silicon oxynitride or the tetraethyl orthosilicate can absorb a stress and the heat generated by the die 20, to effectively protect the first material layer 31. In addition, the second material layer 32 has a good thermal shock resistance property, so that the packaging layer 30 can well protect the die 20 when the temperature difference of the die 20 sharply changes or the temperature difference period of the die 20 changes.

In an optional solution, a thickness of the second material layer 32 is greater than or equal to 1000 angstroms and less than or equal to 3000 angstroms, to ensure that the second material layer 32 has an enough thickness to improve a thermal stress effect of the packaging layer. For example, the thickness of the second material layer 32 may be any thickness greater than or equal to 1000 angstroms and less than or equal to 3000 angstroms, such as 1000 angstroms, 1300 angstroms, 1700 angstroms, 2000 angstroms, 2100 angstroms, 2300 angstroms, 2500 angstroms, 2700 ang- stroms, or 3000 angstroms.

Step 003: Form a third material layer on the second material layer.

Figure 6:
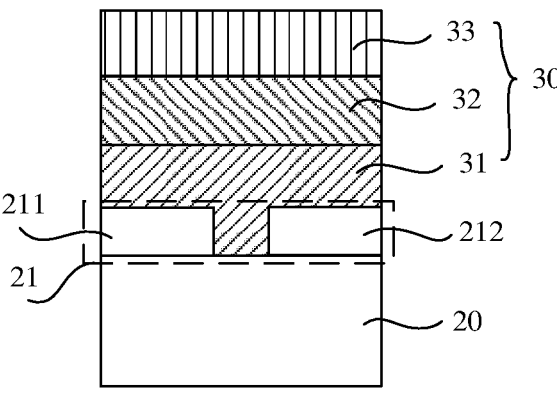

As shown in FIG. 6, for some reference signs in FIG. 6, refer to the same reference signs in FIG. 5. The second material layer 32 is covered with a third material layer 33, and a material of the third material layer 33 may be ultraviolet silicon nitride (UVSIN). When the third material layer 33 is prepared, the third material layer 33 covers a surface that is of the second material layer 32 and that faces away from the first material layer. The third material layer 33 may be directly formed on the second material layer 32 in a sputtering manner, so that the third material layer 33 can be securely connected to the first material layer. The third material layer has good thermal shock resistance and good chemical stability because of being made of the ultraviolet silicon nitride.

In an optional solution, a thickness of the third material layer 33 is greater than or equal to 2000 angstroms and less than or equal to 6000 angstroms, to ensure that the third material layer 33 has an enough thickness to improve a thermal stress effect of the packaging layer. For example, the thickness of the third material layer 33 may be any thickness greater than or equal to 2000 angstroms and less than or equal to 6000 angstroms, such as 2000 angstroms, 2500 angstroms, 3000 angstroms, 3700 angstroms, 4000 ang- stroms, 4300 angstroms, 5200 angstroms, 5700 angstroms, or 6000 angstroms.

Step 004: Embed the die in a substrate.

Figures 7, 8:
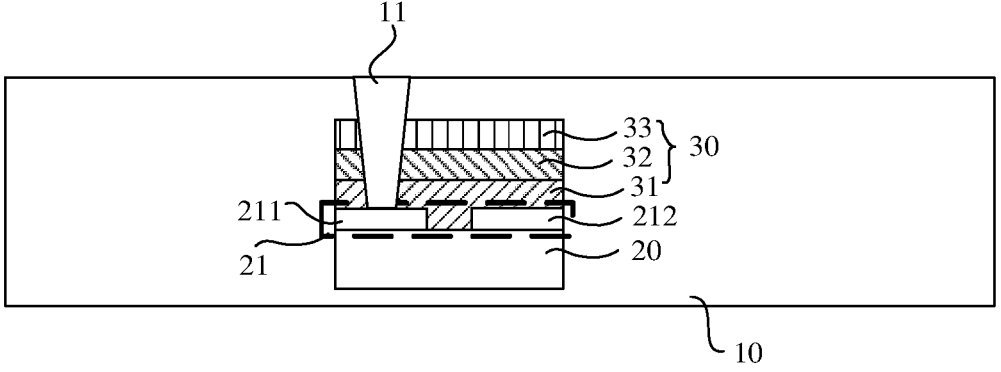
FIG. 8 is an example schematic block diagram of a communications device according to an embodiment of this application.

As shown in FIG. 7, for some reference signs in FIG. 7, refer to the same reference signs in FIG. 6. The die 20 with the packaging layer 30 is embedded in a substrate 10. Specifically, the substrate 10 may be prepared in layers, and the die 20 and the packaging layer 30 are embedded in the substrate 10 during the preparation in layers. Alternatively, a hole may be disposed on the substrate 10 after the substrate 10 is prepared, and the die 20 and the packaging layer 30 are embedded in the hole.

In addition, when the die 20 is embedded in the substrate 10, the integrated circuit layout layer 21 of the die 20 is connected to a circuit layer of the substrate 10. Specifically, the circuit layer on a surface of the substrate 10 may be connected to the integrated circuit layout layer 21 of the die 20 by disposing a via. For example, a via 11 is disposed on the substrate 10. The via 11 is electrically connected to the first cable 211 after passing through the packaging layer 30 (sequentially passing through the third material layer 33, the second material layer 32, and the first material layer 31), so that the first cable 211 is electrically connected to the circuit layer (not shown in the figure) on the surface of the substrate 10. It should be understood that in FIG. 7, only one via 11 is used as an example. A quantity of vias 11 is not limited in this embodiment of this application, and different quantities of vias 11 may be set based on connection requirements of the die 20 and the substrate 10. In addition, a specific preparation manner of the via may be an existing preparation manner.

In the switching power module prepared by using the preparation method, the packaging layer 30 can have a good thermal stress effect through cooperation between the first material layer 31, the second material layer 32, and the third material layer 33. Therefore, under the premise of ensuring reliably of the die 20 during working, a quantity of layers of the packaging layer 30 is reduced, and a thickness of the packaging layer 30 is also reduced, thereby facilitating miniaturization development of the switching power mod- ule.

An embodiment of this application further provides a communications device. The communications device includes the switching power module 200 according to any one of the foregoing embodiments, and a control component 100 connected to the switching power module 200. FIG. 8 is a block diagram of a communications device. The com- munications device includes a control component 100 and a switching power module 200. The control component 100 may send an instruction to control the switching power module 200 to be turned on or turned off, to control a working status of the communications device. It should be understood that a principle and a structure for controlling the switching power module 200 by the control component 100 are an existing common control manner.

In the switching power module, a mixed layer formed by using undoped silicate glass and tetraethyl orthosilicate is filled in a gap between metal protrusions of an integrated circuit layout layer, thereby improving an isolation effect between the metal protrusions. In addition, the mixed layer of the undoped silicate glass and the tetraethyl orthosilicate has a good thermal stress effect. Therefore, when a relatively large temperature difference cycle change occurs during working of a die, a first material layer does not crack, thereby improving a protection effect for the die and also improving reliability of the die.

A person skilled in the art can make various modifications and variations to this application without departing from the protection scope of this application. This application is intended to cover these modifications and variations of this application provided that they fall within the scope of protection defined by the following claims and their equivalent technologies.

What is claimed is:

1. A switching power module, comprising:
a substrate;
a die; and
a packaging layer, wherein:
  the die is embedded in the substrate, and the die includes an integrated circuit layout layer,
  the packaging layer is configured to package the integrated circuit layout layer of the die, the packaging layer comprises a composite material layer covering the integrated circuit layout layer, and the composite material layer comprises at least two material layers that have different functions, and
  the at least two material layers comprise a first material layer covering the integrated circuit layout layer and a second material layer covering the first material layer, the first material layer includes a mixed layer of undoped silicate glass and tetraethyl orthosilicate, a thickness of the first material layer being greater than or equal to 3000 angstroms and less than or equal to 9000 angstroms, a mixing ratio of the undoped silicate glass and the tetraethyl orthosilicate of the mixed layer being greater than or equal to 5:9 and less than or equal to 10:3, the first material layer is filled in a gap between metal protrusions of the integrated circuit layout layer, and the second material layer comprises silicon oxynitride or tetraethyl orthosilicate.

2. The switching power module according to claim 1, wherein a thickness of the second material layer is greater than or equal to 1000 angstroms and less than or equal to 3000 angstroms.

3. The switching power module according to claim 1, wherein the at least two material layers further comprise:
  a third material layer covering the second material layer, wherein
  the third material layer is an ultraviolet silicon nitride layer.

4. The switching power module according to claim 3, wherein a thickness of the third material layer is greater than or equal to 2000 angstroms and less than or equal to 6000 angstroms.

5. The switching power module according to claim 3, wherein the third material layer is formed on the second material layer in a sputtering manner.

6. The switching power module according to claim 1, wherein the first material layer is formed, through high-density plasma deposition, covering the integrated circuit layout layer of the die.

7. The switching power module according to claim 1, wherein a total thickness of a passivation layer, associated with the die, is greater than or equal to 6000 angstroms and less than or equal to 18000 angstroms.

8. A communications device, comprising:
a switching power module; and a control component operatively coupled to the switching power module, wherein the control component is configured to control the switching power module, and the switching power module comprises:
a substrate;
a die; and
a packaging layer, wherein:
  the die is embedded in the substrate, and the die includes an integrated circuit layout layer,
  the packaging layer is configured to package the integrated circuit layout layer of the die, the packaging layer comprises a composite material layer covering the integrated circuit layout layer, and the composite material layer comprises at least two material layers that have different functions, and
  the at least two material layers comprise a first material layer covering the integrated circuit layout layer and a second material layer covering the first material layer, the first material layer comprising a mixed layer of undoped silicate glass and tetraethyl orthosilicate, a thickness of the first material layer being greater than or equal to 3000 angstroms and less than or equal to 9000 angstroms, a mixing ratio of the undoped silicate glass and the tetraethyl orthosilicate of the mixed layer being greater than or equal to 5:9 and less than or equal to 10:3, the first material layer is filled in a gap between metal protrusions of the integrated circuit layout layer, and the second material layer comprises silicon oxynitride or tetraethyl orthosilicate.

9. A switching power module, comprising:
a substrate;
a die having an integrated circuit layout layer; and
a packaging layer, wherein:
  the packaging layer is configured to package the integrated circuit layout layer of the die,
  the packaging layer includes a composite material layer, the composite material layer comprises at least two material layers comprising:
    a first material layer covering the integrated circuit layout layer, the first material layer comprising a mixed layer of undoped silicate glass and tetraethyl orthosilicate, a thickness of the first material layer being greater than or equal to 3000 angstroms and less than or equal to 9000 angstroms, a mixing ratio of the undoped silicate glass and the tetraethyl orthosilicate of the mixed layer being greater than or equal to 5:9 and less than or equal to 10:3, the first material layer is filled in a gap between metal protrusions of the integrated circuit layout layer; and
    a second material layer covering the first material layer, the second material layer comprising silicon oxynitride or tetraethyl orthosilicate.

* * * * *